United States Patent
Song et al.

(10) Patent No.: US 9,543,837 B2
(45) Date of Patent: Jan. 10, 2017

(54) APPARATUS AND SYSTEM FOR ADJUSTING INTERNAL VOLTAGE

(71) Applicant: SK hynix Inc., Icheon-si Gyeonggi-do (KR)

(72) Inventors: Ho Uk Song, Icheon-si (KR); A Ram Rim, Seoul (KR)

(73) Assignee: SK HYNIX INC., Icheon-si (KR)

( * ) Notice: Subject to any disclaimer, the term of this patent is extended or adjusted under 35 U.S.C. 154(b) by 71 days.

(21) Appl. No.: 14/593,138

(22) Filed: Jan. 9, 2015

(65) Prior Publication Data

US 2016/0056716 A1 Feb. 25, 2016

(30) Foreign Application Priority Data

Aug. 21, 2014 (KR) ........................ 10-2014-0109103

(51) Int. Cl.

| | |
|---|---|
| *H03L 5/00* | (2006.01) |
| *H03L 7/06* | (2006.01) |
| *H02M 3/156* | (2006.01) |
| *H02M 1/08* | (2006.01) |
| *G05F 1/00* | (2006.01) |
| *G01R 35/00* | (2006.01) |
| *H02M 1/00* | (2006.01) |

(52) U.S. Cl.
CPC .............. *H02M 3/156* (2013.01); *G01R 35/00* (2013.01); *G05F 1/00* (2013.01); *H02M 1/08* (2013.01); *H02M 2001/0048* (2013.01)

(58) Field of Classification Search
CPC .......... G06F 1/10; G01R 35/00; H02M 3/156; G05F 1/00
USPC ............................ 324/762.01; 327/156, 306
See application file for complete search history.

(56) References Cited

U.S. PATENT DOCUMENTS

2011/0210780 A1* 9/2011 Ko ............................ G06F 1/10
327/306
2012/0194233 A1 8/2012 Kim et al.

FOREIGN PATENT DOCUMENTS

KR 1020110098234 A 9/2011
KR 1020120088441 A 8/2012

* cited by examiner

*Primary Examiner* — Farhana Hoque
(74) *Attorney, Agent, or Firm* — William Park & Associates Ltd.

(57) ABSTRACT

An apparatus for adjusting an internal voltage includes a device characteristic detection circuit which detects a device characteristic, compares the device characteristic with an external clock, and generates a comparison signal, and an internal voltage adjustment circuit which receives an adjustment code generated based on the comparison signal, adjusts a level of an internal voltage, and generates a level-adjusted internal voltage.

19 Claims, 5 Drawing Sheets

A PPARATUS AND SYSTEM FOR ADJUSTING INTERNAL VOLTAGE

CROSS-REFERENCES TO RELATED APPLICATION

The present application claims priority to Korean patent application number 10-2014-0109103, filed on Aug. 21, 2014, which is incorporated by reference herein in its entirety.

BACKGROUND

1. Technical Field

The inventive concept relates to an apparatus and system for adjusting an internal voltage, and more particularly, to an apparatus and system for adjusting an internal voltage, which perform trimming on a voltage while a wafer probing test process.

2. Related Art

To minimize power consumption in mobile apparatuses, efforts to lower operation voltages of circuits have been consistently made. Although the entire power consumption in the mobile apparatuses is reduced through reduction in the operation voltages, the circuits constituting the mobile apparatus may be susceptible to even a small voltage difference. Thus, the circuits which are driven on the basis of a fine voltage difference may abnormally operate by a small voltage difference.

For example, the devices constituting the circuits included in the mobile apparatuses may have different operation characteristics according to the operation voltages, and thus an internal voltage needs to be set depending on the operation characteristics.

SUMMARY

According to an embodiment, there is provided an apparatus for adjusting an internal voltage. The apparatus may include a device characteristic detection circuit which detects a device characteristic in a wafer probing test process, compares the detected device characteristic with an external clock, and generates a comparison signal. The apparatus may also include an internal voltage adjustment circuit which receives an adjustment code generated based on the comparison signal, adjusts a level of an internal voltage, and generates a level-adjusted internal voltage.

According to an aspect of an embodiment, there is provided a system for adjusting an internal voltage. The system may include an internal voltage adjustment apparatus which is provided in a semiconductor apparatus, detects a device characteristic in a wafer probing test process, and adjusts an internal voltage according to an adjustment code. The system may also include a test apparatus which measures a value of the internal voltage in the semiconductor apparatus of a wafer level, and generates the adjustment code based on the detected device characteristic and a measured value of the internal voltage.

According to an embodiment of the invention, an apparatus to adjust an internal voltage comprises a device characteristic detection circuit configured to compare phase differences between a device characteristic signal and an external clock and generate a comparison signal. The apparatus also comprises an internal voltage adjustment circuit configured to adjust an internal voltage according to an adjustment code generated in response to the comparison signal.

DETAILED DESCRIPTION

Figure 1:
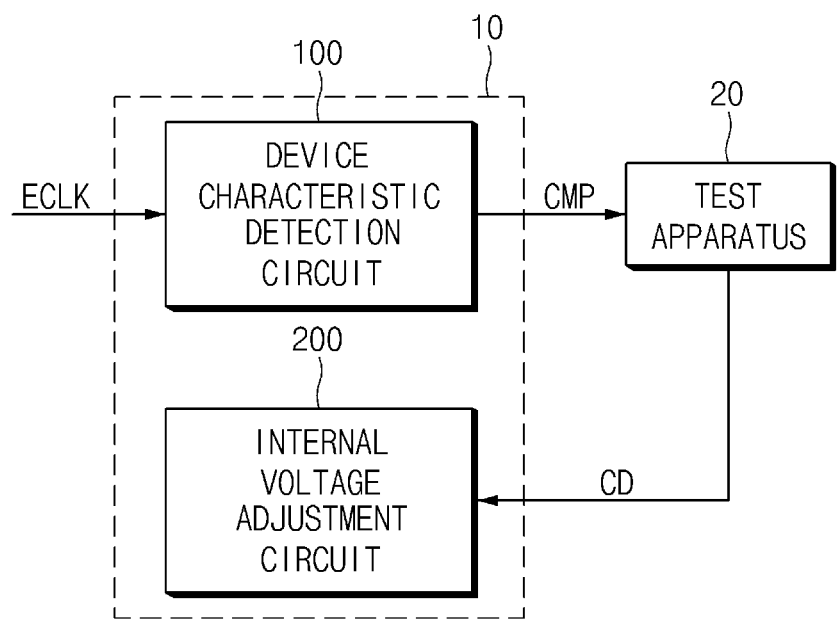
FIG. 1 is a block diagram illustrating an internal voltage adjustment system according to an embodiment of the invention.

Hereinafter, various embodiments will be described in greater detail with reference to the accompanying figures. Like reference numerals in the drawings denote like elements, and overlapping description for the same elements will be omitted. According to the apparatus and system for adjusting an internal voltage according to embodiments of the invention, an internal voltage can be freely adjusted by detecting internal device characteristics in a wafer level and setting a voltage trimming level as compared to a method for adjusting the internal voltage after a trimming process. According to the apparatus and system for adjusting an internal voltage according to embodiments of the invention, the adjustment on an internal voltage only depending on device characteristics can be performed by detecting the internal device characteristics in a wafer level, and thus a semiconductor apparatus, which stably performs an operation regardless of process characteristics affecting the device characteristics, can be implemented. One or more embodiments are to provide an apparatus and system for adjusting an internal voltage, which ensure a certain timing margin regardless of device characteristics by checking the device characteristics and setting a voltage trimming level during a probing test of a wafer level. Other embodiments are to provide an apparatus and system for adjusting an internal voltage, which adjust an internal voltage to be optimized for device characteristics by determining a voltage trimming level only depending on the device characteristics before a mounting process.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these embodiments without departing from the principles and spirit of the inventive concept. Functions or operations described in specific blocks may be performed in order different from the order described in a flowchart when some embodiments are differently implemented. For example, continuous two blocks may be substantially simultaneously performed, or the blocks may be reversely performed according to related functions or operations.

Referring to FIG. 1, a block diagram illustrating an internal voltage adjustment system according to an embodiment of the invention is illustrated.

In FIG. 1, an internal voltage adjustment system 1 may include an internal voltage adjustment apparatus 10 and a test apparatus 20.

The internal voltage adjustment apparatus 10 in the internal voltage adjustment system 1 according to an embodiment of the invention may be provided in a semiconductor apparatus of a wafer level. The internal voltage adjustment apparatus 10 compares a device characteristic signal to which a characteristic of an internal device is reflected in a wafer probing test process with an external clock ECLK. The internal voltage adjustment apparatus 10 also generates a comparison signal CMP.

The test apparatus 20 compares an internal voltage detected in the semiconductor apparatus of a wafer level with the comparison signal CMP received from the internal voltage adjustment apparatus 10. The test apparatus 20 also generates an adjustment code CD. The test apparatus 20 also allows the internal voltage adjustment apparatus 10 to adjust an internal voltage.

In embodiments, the test apparatus 20 may be provided in the outside of the semiconductor apparatus, but an arrangement location of the test apparatus 20 is not limited thereto.

The internal voltage adjustment system 1 according to an embodiment of the invention checks device characteristics before the semiconductor apparatus of a wafer level is mounted. The internal voltage adjustment system 1 also sets a certain voltage trimming level. When the device characteristics are checked in the wafer level before the semiconductor apparatus is mounted, since the device characteristics are not affected by an external voltage or frequency accompanied when the semiconductor apparatus is mounted, only the device characteristics of the internal devices may be properly checked.

The voltage range, which can be adjusted after the semiconductor apparatus is mounted, may be limited to a certain range from a specific trimming level. Therefore, when the trimming level is differently set according to the device characteristics before the semiconductor apparatus is mounted, the device characteristics may be sufficiently reflected to the voltage trimming level. Accordingly, the voltage level may be smoothly adjusted.

Referring back to FIG. 1, the internal voltage adjustment apparatus 10 may include a device characteristic detection circuit 100 and an internal voltage adjustment circuit 200.

The device characteristic detection circuit 100 detects a device characteristic in a wafer probing test process. The device characteristic detection circuit 100 also compares the detected device characteristic with the external clock ECLK. Further, the device characteristic detection circuit 100 also generates the comparison signal CMP. More specifically, the device characteristic detection circuit 100 generates a device characteristic signal to which the device characteristic is reflected and compares the generated device characteristic signal with the external clock ECLK. In embodiments, the device characteristic detection circuit 100 compares phase differences between the device characteristic signal and the external clock ECLK. The device characteristic detection circuit 100 also generates the comparison signal CMP based on a delay value of the device characteristic signal.

For example, when the delay value of the phases between the device characteristic signal and the external clock ECLK is large, it may be regarded that drivability of the device is lowered by the delay value. Accordingly, the internal voltage may be highly adjusted.

The comparison signal CMP is provided to the test apparatus 20. The test apparatus 20 measures an internal voltage to be adjusted from the semiconductor apparatus.

The test apparatus 20 also determines an adjustment level of the internal voltage to be adjusted based on the comparison signal CMP, and generates the adjustment code CD. For example, the adjustment code CD may correspond to a value in which an adjustment amount of the internal voltage is digitalized.

The internal voltage adjustment circuit 200 included in the internal voltage adjustment apparatus 10 adjusts the internal voltage based on the adjustment code CD. The method to adjust the internal voltage based on the adjustment code CD will be described in detail with reference to FIG. 3.

Figure 2:
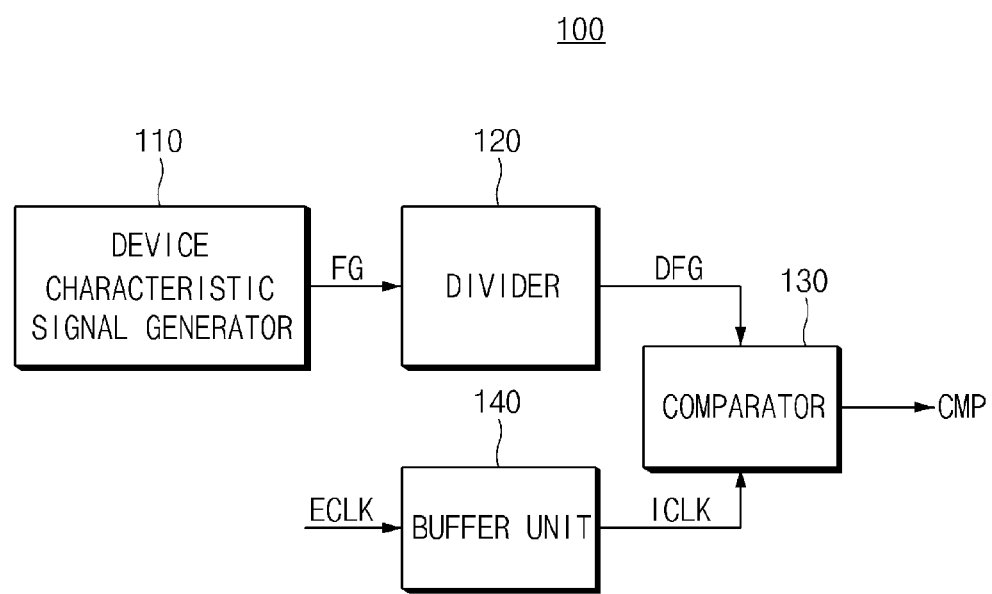
FIG. 2 is a block diagram illustrating a device characteristic detection circuit according to an embodiment of the invention.

Referring to FIG. 2, a block diagram illustrating a device characteristic detection circuit according to an embodiment of the invention is shown.

In FIG. 2, the device characteristic detection circuit 100 may include a device characteristic signal generator 110, a divider 120, and a comparator 130.

The device characteristic signal generator 110 may generate a device characteristic signal FG which oscillates according to the device characteristic. The device characteristic signal generator 110 may include devices which represent a device characteristic of a peripheral circuit in the semiconductor apparatus, for example, transistors. Further, the period of the device characteristic signal FG may become fast or slow according to the device characteristic.

For example, when the device has a fast characteristic, or, when the device provides voltage/current faster than at a desired speed, the operation performance of the device may be good. In addition, the device characteristic signal FG may have a small delay amount. When the device has a slow characteristic, or, when the device provides voltage/current slower than at the desired speed, the operation performance of the device may be degraded. Further, the device characteristic signal FG may have a large delay amount.

In embodiments, the device characteristic signal generator 110 may be implemented with a ring oscillator. For example, the ring oscillator may be implemented in a ring form that odd number operators (for example, inverters or NAND gates) are electrically in series, and an input terminal of a first stage operator and an output terminal of a last stage operator are electrically coupled. The ring oscillator may generate the device characteristic signal FG which oscillates in a certain period.

In embodiments, the device characteristic signal generator 110 may be implemented with characteristic devices which detect the device characteristics. Therefore, the characteristic devices included in the device characteristic signal generator 110 have to be configured of devices having the same operations and process characteristics as the devices constituting the semiconductor apparatus in which the internal voltage adjustment apparatus 10 is included.

In an embodiment, the internal voltage to be adjusted may include various kinds of voltages such as an internal peripheral circuit voltage Vperi, a core voltage Vcore, and an internal power voltage VDDI. Further, the type of characteristic device may be changed according to a kind of internal voltage to be adjusted. For example, when the internal voltage to be adjusted is the internal peripheral circuit voltage Vperi, the device characteristic signal generator 110 has to be configured of devices to which characteristics of devices constituting the peripheral circuit of the semiconductor apparatus are maximally reflected. When the internal voltage to be adjusted is the core voltage Vcore, the device characteristic signal generator 110 has to be configured of substantially the same devices as devices constituting the core of the semiconductor apparatus.

In embodiments, the device characteristic signal generator 110 may be activated in response to a test mode signal to adjust the internal voltage or in response to providing the external clock ECLK to generate the device characteristic signal FG.

The divider 120 divides the device characteristic signal FG by a preset division ratio and generates a divided characteristic signal DFG. In particular, the period of the device characteristic signal FG may be excessively fast. At this time, the divider 120 compares the device characteristic signal FG with the external clock ECLK. The divider 120 also divides the device characteristic signal FG so that a delay value can be detected. In addition, the divider 120 also generates the divided characteristic signal DFG.

The comparator 130 generates the comparison signal CMP based on the phases of the divided characteristic signal DFG and the external clock ECLK.

In embodiments, the device characteristic detection circuit 100 may further include a buffer unit 140 which receives the external clock ECLK and generates an internal clock ICLK suitable to be used in the inside of the device characteristic detection circuit 100. The external clock ECLK may have substantially the same phase as the internal clock ICLK.

More specifically, the comparator 130 compares phases between the divided characteristic signal DFG and the internal clock ICLK. The comparator 130 also calculates a delayed time of the divided characteristic signal DFG with respect to the internal clock ICLK. In addition, the comparator 130 also generates the comparison signal CMP. Therefore, the comparison signal CMP corresponds to the delay value of the divided characteristic signal DFG.

Figure 3:
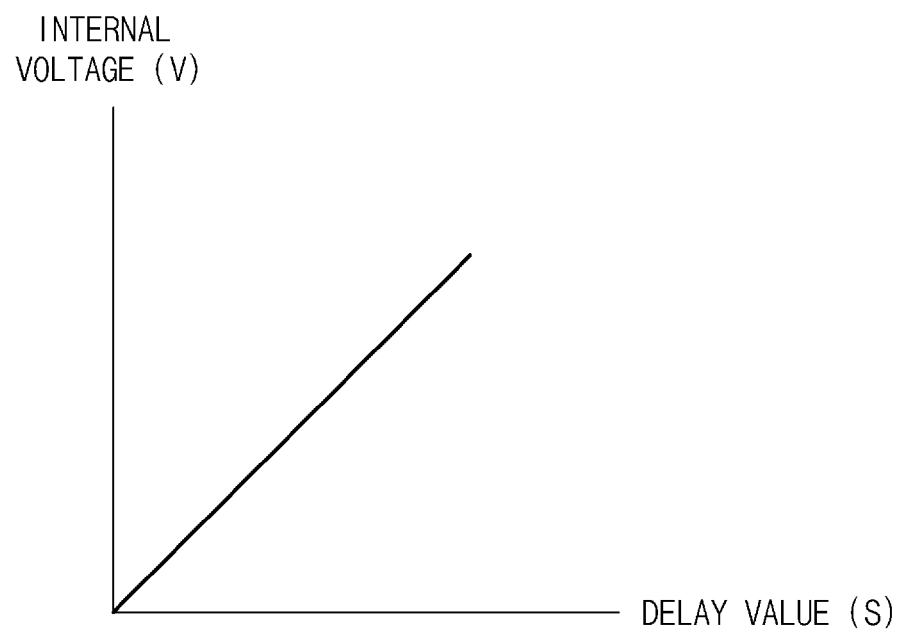
FIG. 3 is a graph explaining an adjustment code generation method in a test apparatus according to an embodiment of the invention.

Referring to FIG. 3, a graph explaining an adjustment code generation method of a test apparatus according to an embodiment of the invention is shown.

In FIG. 3, an X-axis indicates a delay value S, and a Y-axis indicates an appropriate level V of an internal voltage. Here, the delay value indicates a time in which the divided characteristic signal DFG is delayed with respect to the internal clock ICLK. The delay value may have substantially the same value as the comparison signal CMP generated in the comparator 130 of FIG. 2.

It can be seen from FIG. 3 that as the delay value is increased, the appropriate level of the internal voltage is also increased.

As described above, the divided characteristic signal DFG is determined by drivability of internal devices constituting the semiconductor apparatus or the like. As the drivability of the device is degraded, the speed of the signal is decreased and the delay value is increased. Therefore, to reduce the delay value, it is necessary to supplement the drivability of the device through an increase in the internal voltage. On the other hand, when the drivability of the device is good and the delay value is small, the appropriate level of the internal voltage may be relatively lowered. Therefore, the delay value may be proportional to the appropriate level of the internal voltage.

The test apparatus 20 may have previously stored the delay value and information for the appropriate internal value corresponding to the delay value illustrated in FIG. 3. In the alternative, the test apparatus 20 may receive the delay value and the information for the appropriate internal value corresponding to the delay value from the outside. The test apparatus 20 detects an internal voltage to be adjusted from the semiconductor apparatus. The test apparatus 20 also compares a level of the current internal voltage to be adjusted with an appropriate level of an internal voltage according to the comparison signal CMP. The test apparatus 20 determines an adjustment level of the current internal voltage through the comparison between the voltage levels.

In embodiments, the test apparatus 20 may calculate an appropriate level of the internal voltage according to the delay value. The test apparatus 20 may also determine the adjustment level of the current internal voltage, determine an adjustment level of a reference voltage necessary for the adjustment of the internal voltage, and generate the adjustment code CD. It is because the adjustment of the internal voltage may be performed through trimming of the reference voltage. The adjustment of the internal voltage through the trimming of the reference voltage will be described in detail later.

The internal voltage is generated based on the reference voltage. In addition, the adjustment level of the reference voltage and the adjustment level of the internal voltage may have a linear relationship. Therefore, in an embodiment, the internal voltage may be also adjusted in the adjustment of the reference voltage. Moreover, it can be understood that the adjustment levels of the reference voltage and the internal voltage may have a corresponding relationship.

The test apparatus 20 generates the adjustment code CD indicating the adjustment degree of the reference voltage. For example, the adjustment code CD may correspond to a code in which the adjustment value of the reference value is digitized, and may be formed of a plurality of bits.

In embodiments, the adjustment code CD may be generated to represent the adjustment degree of the reference voltage step by step. For example, the test apparatus 20 may generate the adjustment code CD which allows the internal voltage to be increased from the current internal voltage by three steps. More specifically, the adjustment code CD may have the same meaning as information which allows the reference voltage to be increased from the current reference voltage by three steps.

The test apparatus 20 may provide the adjustment code CD indicating the stepwise adjustment degree of the voltage to the internal voltage adjustment circuit 200. The adjustment code CD may represent the adjustment of the voltage in units of a preset magnitude. The preset magnitude may correspond to a magnitude of the voltage which can be divided in a voltage divider which generates a divided voltage.

In embodiments, the internal voltage to be adjusted in the internal voltage adjustment apparatus 10 and the internal voltage adjustment system 1 may include the internal peripheral circuit voltage Vperi, the core voltage Vcore, or the internal power voltage VDDI. The information for correlation between the appropriate internal voltage and the delay value may be changed according to a kind of the internal voltage. The test apparatus 20 may generate the adjustment code CD of the internal voltage based on the appropriate adjustment value of the internal voltage according to the delay value.

Figure 4:
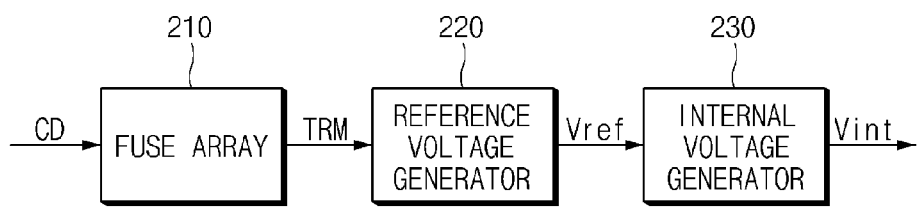
FIG. 4 is a block diagram illustrating an internal voltage adjustment circuit according to an embodiment of the invention.

Referring to FIG. 4, a view illustrating an internal voltage adjustment circuit according to an embodiment of the invention is shown.

In FIG. 4, the internal voltage adjustment circuit 200 may include a fuse array 210, a reference voltage generator 220, and an internal voltage generator 230.

The voltage adjustment information is stored in the fuse array 210 by cutting a certain region of a fuse included in the fuse array 210 based on the adjustment code CD. Further, a trimming signal TRM generated through the fuse cutting is provided to the reference voltage generator 220.

The fuse array 210 may be a fuse array including fuse cells having relatively simple programming units or storage units. The fuse cells may be electric fuse cells which perform programming by interrupting a conduction path of a metal-oxide-semiconductor (MOS) transistor or anti-fuse cells which perform programming through a conduction path formed by causing breakdown of a MOS transistor.

The setting of a reference voltage Vref is completed by the trimming signal TRM. In addition, the reference voltage generator 220 generates the reference voltage Vref and provides the generated reference voltage Vref to the internal voltage generator 230.

In embodiments, the reference voltage generator 220 may be implemented with a voltage divider including a plurality of resistors electrically coupled in series and a voltage stabilizer (regulator).

The reference voltage generator 220 may generate the reference voltages having different levels based on the trimming signal TRM. For example, the reference voltage generator 220 may select a specific node of the voltage divider in which a plurality of resistors are electrically coupled in series according to the trimming signal TRM to provide the reference voltage Vref. The reference voltage generator 220 also stabilizes the reference voltage Vref through the voltage stabilizer. In addition, the reference voltage generator 220 also provides the stabilized reference voltage Vref to the internal voltage generator 230.

The internal voltage generator 230 may generate an internal voltage Vint based on the reference voltage Vref. The internal voltage generator 230 according to an embodiment of the invention generates the internal voltage Vint depending on the reference voltage Vref which is adjusted according to the device characteristics. Therefore, the internal voltage to which the device characteristics are reflected is generated. Accordingly, the certain timing margin may be ensured regardless of the characteristics of the internal devices in the semiconductor apparatus.

As described above, the internal voltage Vint may correspond to the internal peripheral circuit voltage Vperi, the core voltage Vcore, the internal power voltage VDDI, or the like. The internal voltage generator 230 may generate the internal voltage Vint through other methods according to a kind of internal voltage Vint.

For example, the method to generate the internal voltage Vint may be changed according to the adjusted reference voltage Vref. As a result, the adjusted value of the internal voltage Vint may be changed according to the changed internal voltage generation method.

Figure 5:
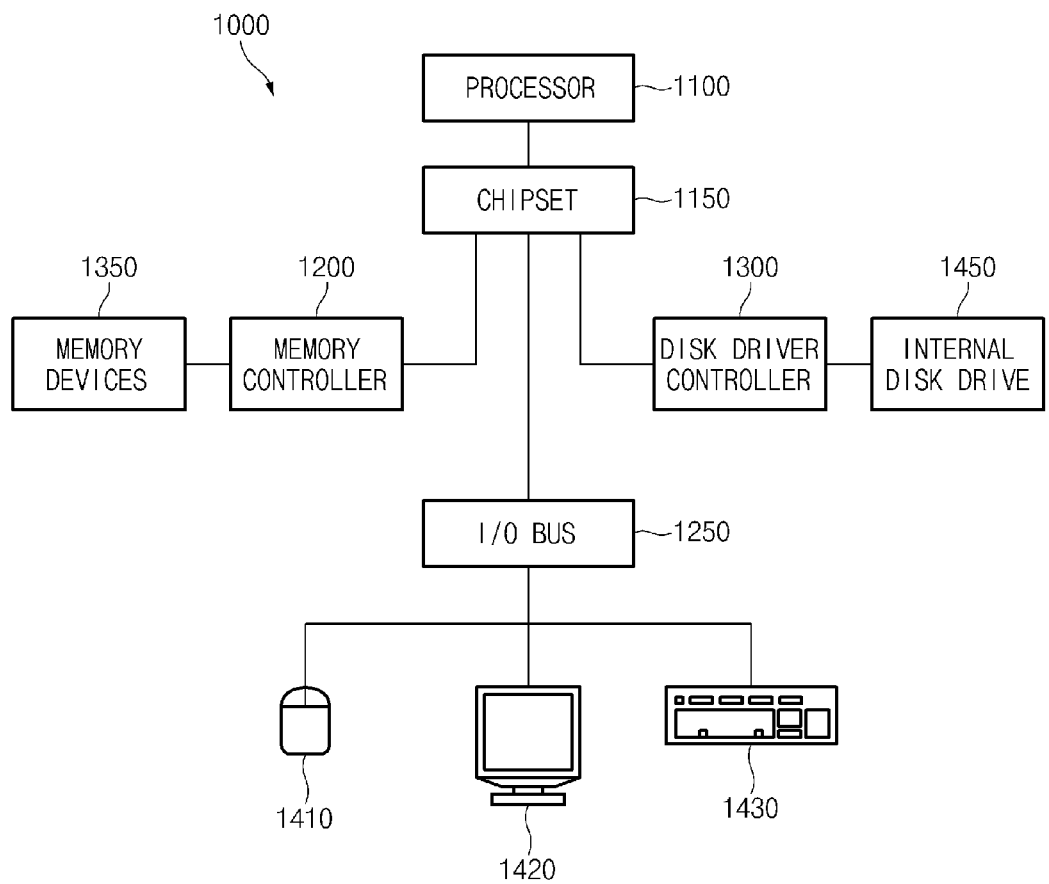
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller can receive a request provided from the processor 1100 through the chipset 1150. The memory controller 1200 may be electrically coupled to one or more memory devices 1350. The memory devices 1350 may include the apparatus and system described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As described above, the apparatus and system to adjust an internal voltage according to embodiments of the invention may detect device characteristics in a semiconductor apparatus of a wafer level in a probing test process. The apparatus and system may also perform trimming on a voltage, and adjust the voltage by maximally reflecting the device characteristics.

The apparatus and system to adjust an internal voltage according to embodiments of the invention may improve stability of an overall operation of the semiconductor apparatus by ensuring a certain timing margin through the voltage adjustment even when the difference in drivability of an internal device occurs.

An above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the disclosure and are intended to fall within the scope of the appended claims.

What is claimed is:

1. An apparatus for adjusting an internal voltage, the apparatus comprising:
   a device characteristic detection circuit configured to detect a device characteristic in a wafer probing test process, divide, according to a preset ratio, a device characteristic signal generated based on the device characteristic, compare the divided device characteristic signal with an external clock, and generate a comparison signal; and
   an internal voltage adjustment circuit configured to receive an adjustment code generated based on the comparison signal, adjust a level of an internal voltage, and generate a level-adjusted internal voltage.

2. The apparatus of claim 1, wherein the device characteristic detection circuit includes:
   a device characteristic signal generator configured to generate the device characteristic signal according to the device characteristic in the wafer probing test process;
   a divider configured to divide the device characteristic signal according to the preset division ratio, and generate the divided characteristic signal; and
   a comparator configured to compare a phase of the divided characteristic signal with a phase of the external clock, detect a delay time of the divided characteristic signal, and generate the comparison signal.

3. The apparatus of claim 2, wherein the device characteristic detection circuit is provided in a semiconductor apparatus of a wafer level, and the device characteristic signal generator includes a same characteristics device as devices constituting the semiconductor apparatus.

4. The apparatus of claim 3, wherein the device characteristic signal generator includes a ring oscillator including the characteristic devices.

5. The apparatus of claim 3, wherein the device characteristic detection circuit further includes a buffer unit configured to receive the external clock, and provide an internal clock for the semiconductor apparatus.

6. The apparatus of claim 1, wherein the internal voltage adjustment circuit includes:
a fuse array configured to store voltage adjustment information in a fuse based on the adjustment code, and provide a trimming signal; and
a reference voltage generator configured to perform trimming on a reference voltage based on the trimming signal.

7. The apparatus of claim 6, wherein the internal voltage adjustment circuit further includes an internal voltage generator configured to generate the internal voltage based on the reference voltage.

8. The apparatus of claim 7, wherein the internal voltage includes at least one of an internal peripheral circuit voltage, a core voltage, and an internal power voltage.

9. A system for adjusting an internal voltage, the system comprising:
an internal voltage adjustment apparatus provided in a semiconductor apparatus, and configured to detect a device characteristic in a wafer probing test process, divide, according to a preset ratio, a device characteristic signal generated based on the device characteristic, compare the divided device characteristic signal with an external clock, generate a comparison signal and adjust an internal voltage according to an adjustment code; and
a test apparatus configured to measure a value of the internal voltage in the semiconductor apparatus, and generate the adjustment code based on the the comparison signal and a measured value of the internal voltage.

10. The system of claim 9, wherein the internal voltage adjustment apparatus includes:
a device characteristic detection circuit configured to generate the comparison signal through comparison between the detected device characteristic and the external clock; and
an internal voltage adjustment circuit configured to receive the adjustment code generated based on the comparison signal, and generate the adjusted internal voltage.

11. The system of claim 10, wherein the device characteristic detection circuit includes:
a device characteristic signal generator configured to generate the device characteristic signal according to the device characteristic in the wafer probing test process;
a divider configured to divide the device characteristic signal according to the preset division ratio, and generate the divided device characteristic signal; and
a comparator configured to compare a phase of the divided device characteristic signal with a phase of the external clock, detect a delay time of the divided characteristic signal, and generate the comparison signal.

12. The system of claim 10, wherein the internal voltage adjustment circuit performs trimming on a reference voltage based on the adjustment code, and generate the adjusted internal voltage based on the trimmed reference voltage.

13. The system of 10, wherein the test apparatus generates the adjustment code corresponding to a level difference between the measured value of the internal voltage and a level of an appropriate internal voltage based on information for the level of the appropriate internal voltage according to the comparison signal.

14. An apparatus to adjust an internal voltage, the apparatus comprising:
a device characteristic detection circuit configured to compare phase differences between a device characteristic signal and an external clock and generate a comparison signal;
an internal voltage adjustment circuit configured to adjust an internal voltage according to an adjustment code generated in response to the comparison signal;
a fuse array configured to store voltage adjustment information by cutting a region of a fuse according to the adjustment code; and
a reference voltage generator configured to perform trimming on a reference voltage based on the stored voltage adjustment information.

15. The apparatus of claim 14, further comprising:
a test apparatus configured to determine an adjustment level of the internal voltage according to the comparison signal, and generate the adjustment code.

16. The apparatus of claim 15, wherein the test apparatus is configured to compare a level of the internal voltage with an appropriate level of the internal voltage according to the comparison signal.

17. The apparatus of claim 14, wherein the adjustment code allows the internal voltage to increase.

18. The apparatus of claim 14, wherein the reference voltage generator is configured to stabilize the reference voltage and provide the stabilized reference voltage to an internal voltage generator.

19. The apparatus of claim 18, wherein the internal voltage is generated according to the reference voltage adjusted according to device characteristics.

* * * * *